(12) United States Patent
Yamazaki et al.

(10) Patent No.: US 9,159,529 B2
(45) Date of Patent: Oct. 13, 2015

(54) SCANNING ELECTRON MICROSCOPE

(71) Applicant: HITACHI HIGH-TECHNOLOGIES CORPORATION, Tokyo (JP)

(72) Inventors: Minoru Yamazaki, Tokyo (JP); Hideyuki Kazumi, Tokyo (JP); Yuko Sasaki, Tokyo (JP); Makoto Suzuki, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/379,704

(22) PCT Filed: Feb. 18, 2013

(86) PCT No.: PCT/JP2013/053786
§ 371 (c)(1),
(2) Date: Aug. 19, 2014

(87) PCT Pub. No.: WO2013/129147
PCT Pub. Date: Sep. 6, 2013

(65) Prior Publication Data
US 2015/0014531 A1 Jan. 15, 2015

(30) Foreign Application Priority Data
Feb. 28, 2012 (JP) ................................. 2012-040865

(51) Int. Cl.
*G01N 23/00* (2006.01)
*H01J 37/147* (2006.01)
*H01J 37/244* (2006.01)
*H01J 37/28* (2006.01)

(52) U.S. Cl.
CPC ............. *H01J 37/147* (2013.01); *H01J 37/244* (2013.01); *H01J 37/28* (2013.01); CPC .......... *H012237/057* (2013.01); *H01J 2237/063* (2013.01); *H01J 2237/15* (2013.01); *H01J 2237/1501* (2013.01); *H01J 2237/2449* (2013.01); *H01J 2237/24495* (2013.01); *H01J 2237/2814* (2013.01) J

(58) Field of Classification Search
CPC ............. H01J 37/244; H01J 2237/244; H01J 2237/2448; H01J 2237/2806; G01N 23/2251; G01N 23/225
USPC .................................................. 250/306–311
See application file for complete search history.

(56) References Cited

U.S. PATENT DOCUMENTS

2004/0094712 A1* 5/2004 Kaji et al. ..................... 250/310
2006/0186351 A1* 8/2006 Nishiyama et al. ........ 250/492.1
(Continued)

FOREIGN PATENT DOCUMENTS

JP 2006-114426 A 4/2006
(Continued)

OTHER PUBLICATIONS

International Search Report issued in International Application No. PCT/JP2013/053786 dated Mar. 26, 2013, with English translation.

*Primary Examiner* — Michael Maskell
(74) *Attorney, Agent, or Firm* — McDermott Will & Emery LLP

(57) ABSTRACT

It is an object of the present invention to provide a scanning electron microscope for discriminating an angle of an electron ejected from a sample without providing an opening for restricting the angle at outside of an axis. In order to achieve the object described above, there is proposed a scanning electron microscope which includes a deflector to deflect an irradiating position of an electron beam, and a control unit to control the deflector, and further includes a detector to detecting an electron provided by irradiating a sample with the electron beam, an opening configuring member arranged between the detector and the deflector and having an opening for passing the electron beam, and a secondary signal deflector to deflect an electron ejected from the sample, in which the secondary signal deflector is controlled to deflect the electron ejected from the sample toward an opening of passing the electron beam in accordance with a deflection control of the deflector.

11 Claims, 5 Drawing Sheets

(56) References Cited

U.S. PATENT DOCUMENTS

2008/0121803 A1* 5/2008 Shojo et al. ............... 250/307
2009/0039264 A1* 2/2009 Ikegami et al. ............ 250/311
2009/0272899 A1* 11/2009 Yamazaki et al. ......... 250/307

FOREIGN PATENT DOCUMENTS

| JP | 2006-228999 A | 8/2006 |
| JP | 2011-247808 A | 12/2011 |
| JP | 2012-003902 A | 1/2012 |

* cited by examiner

F I G . 1
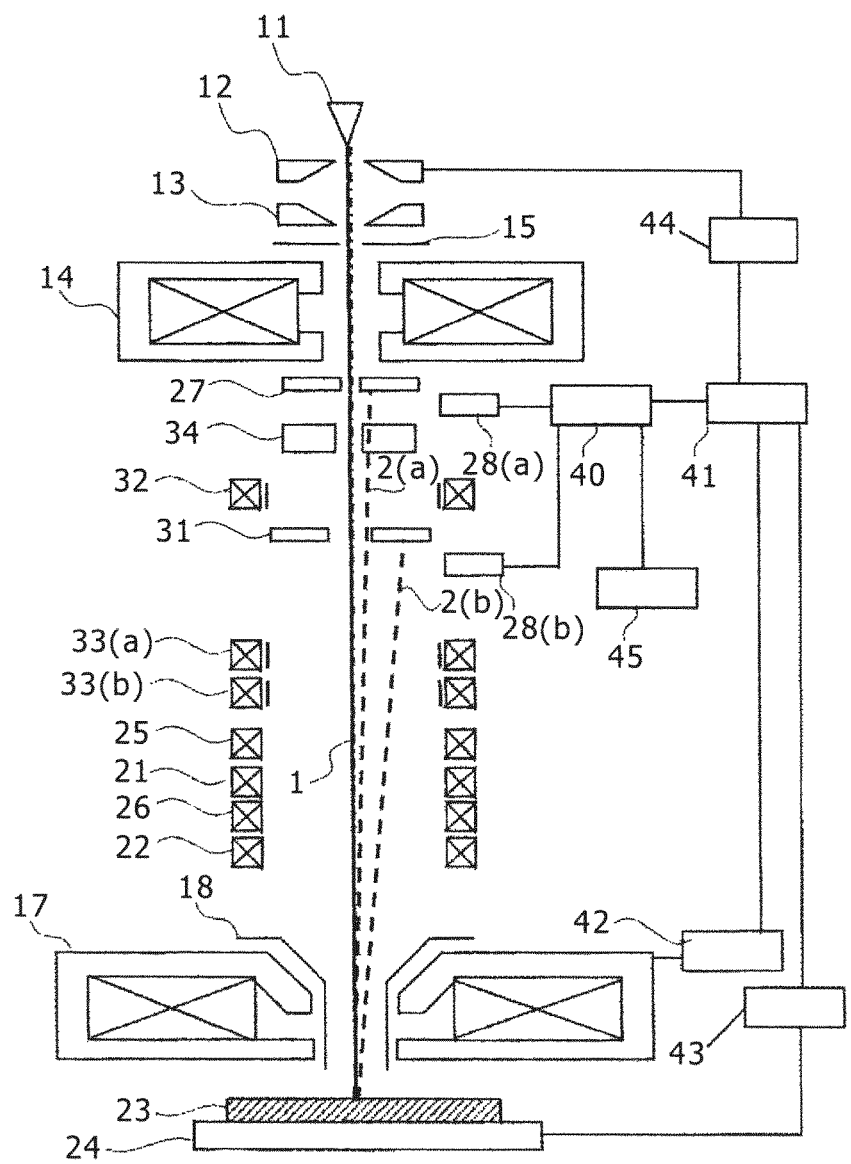

(a)      (b)

FIG.8
(a)
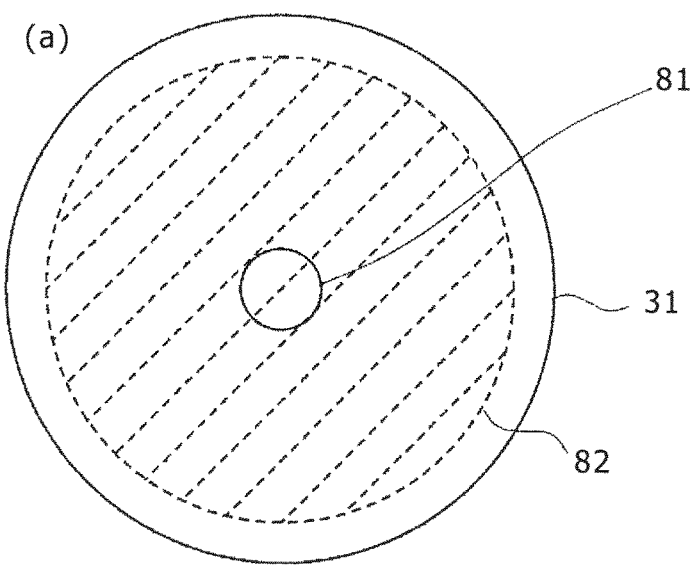
(b)
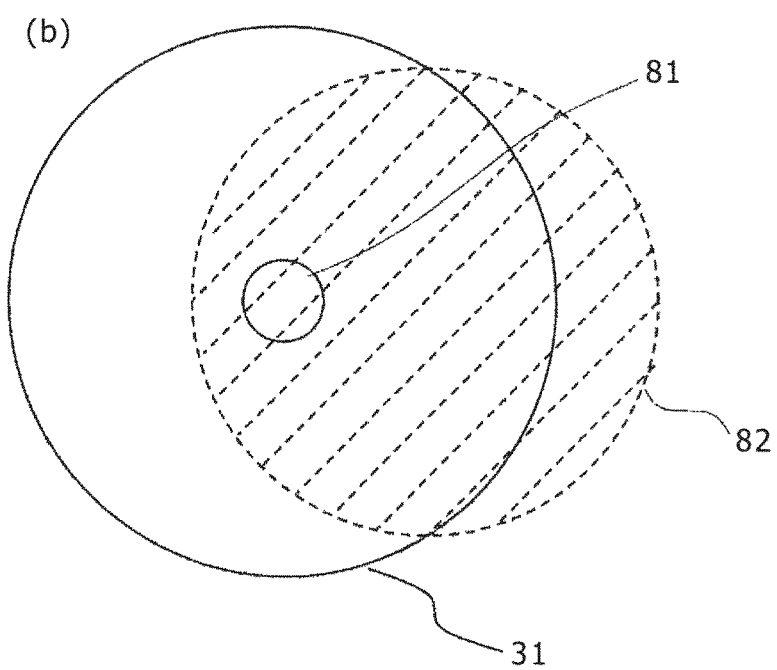

SCANNING ELECTRON MICROSCOPE

RELATED APPLICATIONS

This application is the U.S. National Phase under 35 U.S.C. §371 of International Application No. PCT/JP2013/053786, filed on Feb. 18, 2013, which in turn claims the benefit of Japanese Application No. 2012-040865, filed on Feb. 28, 2012, the disclosures of which are incorporated by reference herein.

TECHNICAL FIELD

The present invention relates to a scanning electron microscope for detecting an electron provided by irradiating a sample with an electron beam, particularly relates to a scanning electron microscope including a deflector for deflecting an orbit of an electron ejected from the sample.

BACKGROUND ART

In recent years, miniaturization of a measurement or an inspection object of a scanning electron microscope such as a semiconductor device or the like has been progressed. A dimension of a pattern in a depth direction (Z direction) is increased relative to a size of the pattern in a sample surface direction (X-Y direction) in accordance with the miniaturization, and an increase in an aspect ratio (dimension in Z direction/dimension in X or Y direction) of the pattern becomes significant. There is an electron ejected from a bottom portion of such a pattern which collides with a side wall of the pattern.

On the other hand, shortening of a time period required for a measurement of an inspection has been requested along with a request for measuring a fine pattern. In recent times, portions of measuring and inspecting a semiconductor device tend to increase, and a measured point (visual field of electron beam) needs to move at high speed in order to realize a high throughput. Patent Literature 1 discloses a technology for speeding up to move a visual field which uses an image shift deflector. Also, Patent Literature 1 describes to control a deflection angle of a secondary electron in accordance with an electric field or a magnetic field which is generated in accordance with an image shift in order to guide an electron to a conversion electrode that is arranged at outside of an axis of an electron beam and on a side of an electron source of a detector, or the detector.

CITATION LIST

Patent Literature

Patent Literature 1: Japanese Unexamined Patent Application Publication No. 2012-3902

SUMMARY OF INVENTION

Technical Problem

According to the scanning electron microscope disclosed in Patent Literature 1, although the electron can be guided stably in a prescribed direction without depending on a deflection direction of the image shift, the electron is detected by being deflected to outside of an axis of an electron beam (passage orbit through which the electron beam passes when the beam does not undergo a deflecting operation), and therefore, an opening for angle restriction needs to be installed while ensuring the passage orbit through which the primary electron beam passes.

In the following, a description will be given of a scanning electron microscope with an object of discriminating an angle of an electron ejected from a sample without providing an opening for angle restriction at outside of an axis.

Solution to Problem

As an aspect for achieving the object described above, there is proposed a scanning electron microscope includes an electron source, a deflector to deflect an irradiating position of an electron beam emitted from the electron source, and a control unit to control the deflector, and further includes a detector to detect an electron provided by irradiating a sample with the electron beam, an opening configuring member arranged between the detector and the deflector and having an opening for passing the electron beam, and a secondary signal deflector to deflect the electron ejected from the sample, in which the control unit controls the secondary signal deflector to deflect the electron ejected from the sample toward the opening for passing the electron beam in accordance with a deflection control of the deflector.

Advantageous Effects of Invention

According to the configuration described above, an angle of an electron ejected from a sample can be discriminated without providing an opening for angle restriction at outside of an axis.

BRIEF DESCRIPTION OF DRAWINGS

FIG. 1 is a view showing an outline of a scanning electron microscope.

FIGS. 8(*a*) and 8(*b*) illustrate views for explaining a difference between when a dispersion orbit center of a secondary signal and an opening for angle restriction coincide with each other and when the both do not coincide with each other.

DESCRIPTION OF EMBODIMENTS

Figure 2:
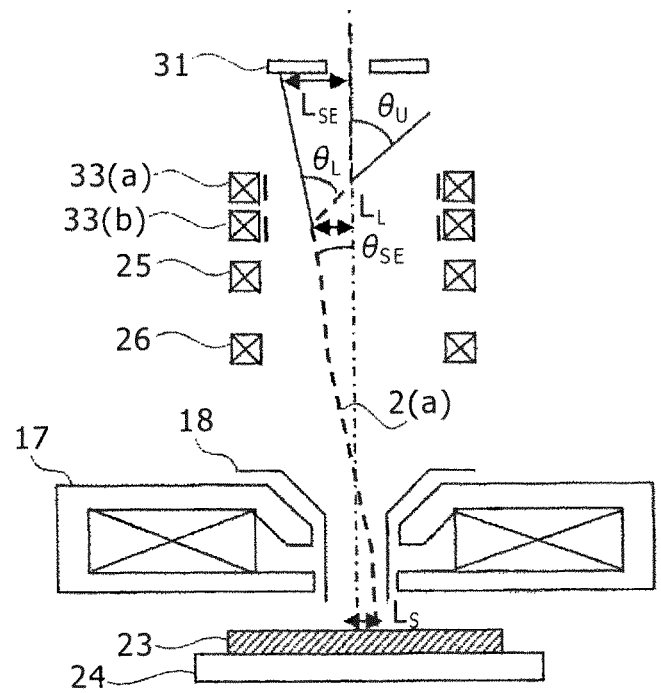
FIG. 2 is a view showing an example of a deflected orbit of a secondary signal by a secondary signal deflector.

In recent years, miniaturization of a semiconductor device has been progressed to several tens nm or smaller, and mass production of a device having a shape of not only a structure of a planar type of a prior art but a three-dimensional structure represented by Fin-FET is going to be started. Further, deepening of a three-dimensional pattern of a trench, a hole or the like is also conspicuous, and an aspect ratio of a gate in a Flash memory is progressed to 10 or larger, and an aspect ratio of a contact hole is progressed to 30 or larger. Even in CD-SEM (Critical Dimension Scanning Electron Microscope) or DR-SEM (Detect Review Scanning Electron Microscope) which is used for measuring a length of a pattern or inspecting a defect in-line, a requested specification becomes severer year by year. In the electron microscope application apparatus, an image is configured by detecting a secondary electron ejected from a surface of a sample by scanning a primary electron on the sample. When miniaturization of a device is progressed further, an edge contrast is deteriorated by diffusing a primary electron at inside of a sample, and therefore, an observation by SEM is anticipated to be severer.

Particularly, at a bottom portion of a pattern, an ejected secondary electron impinges on a side wall of a sample again and is vanished, and therefore, a shape of the bottom is more difficult to be viewed. Therefore, it is conceivable to adhere positive charge up to a surface of the sample, or install an electrode for generating an electric field for guiding an electron in an upper direction. However, in a case where a surface of the sample is a conductor or in a case where a bottom of a pattern is an insulator, it is difficult to configure sufficient positive charge up for pulling up a secondary electron, and it is difficult to emphasize the bottom of the pattern by a potential contrast. In such a case, a method of making a device provide a function of discriminating a secondary electron by an energy or an angle and selectively detecting only a secondary electron ejected from a bottom of a pattern to emphasize is effective. When an energy filter is used, a specific pattern contrast can be emphasized by using a difference in an electric potential of a material. The method is effective in a case where plural different materials of Low-k material, a metal gate and the like are used.

Further, as another means, a specific pattern contrast can be emphasized by discriminating a secondary electron by an angle of an elevation or an azimuth. When the secondary electron is discriminated in a direction of the angle of an elevation, information of a bottom or a side face of a pattern can be obtained by selectively detecting a secondary electron ejected in a direction vertical to a surface of a sample.

An energy filter is generally configured by using plural conductive meshes or electrodes. Its energy resolution is determined by a flatness of an electric field configured or an electric field intensity, or an entry angle of a secondary electron, an orbit dispersion or the like. When there is a dispersion in an energy resolution in acquiring an image, a potential of cutting an energy is changed, and therefore, a dispersion is brought about in an image contrast or a brightness degree.

On the other hand, in discriminating an angle, a shield is generally placed for restricting a secondary electron orbit, and, for example, only a secondary electron passing through a hole or the like opened at the shield is selectively detected. At this occasion, for example, when a secondary electron in a direction vertical to a sample is going to be selectively detected, an effect of discriminating an angle cannot be achieved in a case where an orbit of a corresponding secondary electron impinges on a shield.

Further, when an electron beam is deflected by an image shift deflector or the like, there is a case where not only an orbit of the electron beam but also an orbit of a secondary electron or a back-scattering electron is bent, and proper angle discrimination is difficult to carry out.

Hence, according to the present embodiment, a description will be given of a scanning electron microscope which discriminates an angle accurately and restrains an impingement of an electron to a shield other than a shield for discriminating the angle at maximum by using both of an opening for discriminating the angle and an opening for passing an electron beam as one, and providing a deflector for deflecting to direct an electron ejected from the sample and a detector for detecting an electron passing the opening or an electron brought about by the electron at the opening. A passage having the least possibility of impinging on an electron beam passage, a member configuring an electrooptic system is an orbit of passing an electron beam. Therefore, an impingement on other member can be restrained at maximum while discriminating an angle highly accurately by deflecting an electron ejected from a sample to pass along an opening of passing an electron beam without depending on a deflection by an image shift deflector or the like.

Further, when an opening configuring member which is provided with an opening for angle discrimination is made to be an electron detector, or a conversion electrode of an impacted electron, the largest number of electrons can be introduced to a detecting face of a detector, or a conversion electrode face which is provided axisymmetrically relative to an electron beam, and therefore, maximization of a detection efficiency can be realized.

According to the present embodiment, a description will be given of a scanning electron microscope which does not need a specific standard sample, and can adjust to control a secondary electron orbit by being interlocked with image shift. Further, an angle of a secondary electron entering an energy filter can be fixed by a device configuration shown in FIG. 1, and therefore, a signal can be discriminated in a state where an energy resolution is maintained constant.

According to the present embodiment, a description will mainly be given of an example of controlling a secondary electron orbit by using a secondary electron aligner for stably discriminating a signal when a secondary electron is selectively detected by using a secondary electron restriction plate and an energy filter. First, a configuration and a principle will be described. FIG. 1 is an outline configuration view of a scanning electron microscope. A primary electron beam 1 is extracted by applying an extraction voltage 12 between an anode 11 and an extraction electrode 13. The primary electron beam 1 undergoes a converging operation by a condenser lens 14, and undergoes a scanning deflection by an upper scanning deflector 21 and a lower scanning deflector 22. Deflection intensities of the upper scanning deflector 21 and the lower scanning deflector 22 are adjusted to carry out two-dimensional scanning on a sample 23 with a lens center of an objective lens 17 as a fulcrum. Similarly, the primary electron beam 1 undergoes a deflecting operation by an upper image shift deflector 25 and a lower image deflector 26 for changing a scanning position. The primary electron beam 1 which undergoes the deflection is further accelerated by an acceleration circular cylinder 18 which is provided at a passage of the objective lens 17.

The primary electron beam 1 which has been accelerated at the later stage is focused by a lens operation of the objective lens 17 to reach the sample 23 held by a holder 24. A secondary electron is ejected from a surface of the sample 23 by an exposure of the primary electron. The secondary electron can be classified into a secondary electron 2(a) of a high angle in a direction in parallel with the axis, and a secondary electron (b) of a low angle component in a direction in parallel with a surface of the sample (an electron which is ejected in a wide range relative to that of the secondary electron of the high angle centering on the electron beam axis). The secondary electron progresses in a direction inverse to that of the primary electron along the axis to reach a secondary electron restriction plate 31. The secondary electron 2(a) of the high angle passes through an aperture of the secondary electron restriction plate 31, passes through an energy filter 34, thereafter, collides with a reflection plate 27 to be converted into a tertiary electron, and is detected by an upper detector 28(a).

The secondary electron restriction plate 31 is provided with an aperture for passing the electron beam and is arranged between the upper detector 28(*a*) and the image shift deflectors in an electron beam axis direction as described later. The aperture for passing the electron beam is configured to selectively pass the high angle component of the electrons ejected from the sample.

The secondary electron 2(*b*) on the low angle side collides with the secondary electron restriction plate 31 (conversion electrode) to be converted into a tertiary electron, and is detected by a lower detector 28(*b*). Detected signals are processed by using a computing unit 40 to convert the signals detected by the respective detectors into images. Obtained signals may be added to configure into images in order to increase an image S/N. The lower detector 28(*b*) is arranged between secondary electron aligners described later and the upper detector 28(*a*).

Incidentally, the computing unit 40 is connected to a control unit 41, and executes a prescribed calculating operation based on an instruction of the control unit 41. Further, the control unit 41 is connected also to an objective lens control power source 42, a stage control power source 43, and an acceleration voltage control power source 44, and controls respective configuring elements of the electron microscope based on an optical condition and a control condition which are previously stored as a recipe.

Although the secondary electron 2(*a*) of the high angle needs to pass through the aperture of the secondary electron restriction plate 31 in order to discriminate the angle, there is a case where the orbit of the secondary electron is apart from the axis by the use of the image shift or the influence bypassing the objective lens 17. Conversely, there is also a case where the aperture of the secondary electron restriction plate 31 is mounted intentionally at a position apart from the axis as a result of an assembling accuracy or an axis adjusting accuracy, or with an object of selecting an aperture diameter. The secondary signal aligner (secondary signal deflector) is used for always passing the secondary electron 2(*a*) of the high angle to the aperture of the secondary electron restriction plate 31. The secondary electron orbit is controlled to deflect by using a secondary electron aligner II(L) 33(*a*) and a secondary electron aligner II(U) 33(*b*). As the secondary electron aligner, a Wien filter configured by an electrode and a magnetic field coil is used so as not to give an influence on an orbit of the primary electron.

As described above, a detection efficiency of the lower detector 28(*b*) can be improved by deflecting the orbit of the electron ejected from the sample to be in line with the electron beam axis (coaxially). FIG. 8 illustrates views for explaining its principle. FIG. 8 illustrates the secondary electron restriction plate 31 which is viewed from a side of the sample 23, and which is provided with an aperture 81 for passing the electron beam (aperture for passing high angle side electron). FIG. 8(*a*) shows a state where a center of a dispersion range 82 of the electron ejected from the sample coincides with the aperture 81 for passing the electron beam, and FIG. 8(*b*) shows a state where the center of the dispersion range 82 of the electron ejected from the sample is apart from the aperture 81 for passing the electron beam. As shown in FIG. 8, in a case where the electrons ejected from the sample have a spread, whereas in a case of FIG. 8(*a*), all of the electrons collide with the secondary electron restriction plate 31 except the aperture 81 for passing the electron beam, in a case of FIG. 8(*b*), a portion of the dispersion range 82 of the electrons does not collide with the secondary electron restriction plate 31.

In this way, it is preferable to bring about a state as shown in FIG. 8(*a*) in order to efficiently detect the ejected electron having an angular range to some degree, and a detection efficiency of the lower detector 28(*b*) can be made to be high by deflecting the orbit of the electron ejected from the sample in line with the electron beam axis. According to the device of the present embodiment, even in a case where the orbit of the secondary electron is changed, a reduction in the detection efficiency can be restrained.

The energy filter 34 is configured by, for example, plural mesh-like electrodes for generating an electric field such that the electron ejected from the sample is repulsed. The energy filter 34 is provided for guiding an electron having a desired energy selectively to the side of the detector by changing an electric field intensity thereof. The energy filter 34 is installed on a side of the electron source 11 of the secondary electron restriction plate 31.

Further, according to the energy filter 34, it is general to provide an aperture or a pipe for ensuring a passage of passing the primary electron, and it is necessary to prevent the secondary electron (a) of the high angle from invading the aperture or the pipe. Hence, similarly, a secondary electron aligner I 32 is provided and the angle of the secondary electron entering the energy filter 34 is controlled to deflect. The angle of the secondary electron 2(*a*) of the high angle passing through the secondary electron diaphragm 31 is controlled by the secondary electron aligner II(L) 33(*a*) and the secondary electron aligner II(U) 33(*b*), and therefore, an angle of entering the energy filter 35 can be maintained constant by the secondary electron aligner I32. As a result, also an effect of making the energy resolution of the energy filter constant can be achieved. Although according to a configuration example of FIG. 1, an angle discrimination and an energy discrimination are made to be compatible with each other, a configuration of removing the secondary electron restriction plate 31 may be constructed for carrying out only the energy discrimination.

FIG. 2 shows a concept of a method of controlling the secondary electron aligners II 33(*a*) and 33(*b*). The sample is irradiated with the primary electron at a position $L_s$ apart from the axis on the surface of the sample by using the image shifts 25 and 26. The high angle secondary electron 2(*a*) ejected therefrom progresses along the axis in an inverse direction. The high angle secondary electron 2(*a*) undergoes a deflecting operation in passing through the objective lens 17, and the image shifts 25 and 26 and ingresses to the secondary electron aligner II(L) 33(*b*) by an axis apart amount $L_L$ and an angle $\theta_{SE}$. The secondary electron 2(*a*) is deflected by an angle $\theta_L$ so as to pass through a center of the secondary electron aligner II(U) 33(*a*) by using the secondary electron aligner II(L) 33(*b*). Next, when the high angle secondary electron 2(*a*) is deflected by an angle $\theta_U$ to be in parallel with the axis, the high angle secondary electron 2(*a*) can be passed through a center of the secondary electron restriction plate 31 in parallel with the axis. As a condition for satisfying the control, the following mathematical expressions (1) and (2) are derived by a geometrical calculation. Here, notation $Z_{SEALU}$ designates a height of the secondary electron aligner II (U) 33(*a*), and notation $Z_{SEALL}$ designates a height of the secondary electron aligner II(L) 33(*b*)

Mathematical Expression 1

$$\tan(\pi - \theta_L - (\pi/2 - \theta_{SE})) = (Z_{SEALU} - Z_{SEALL})L_L \quad (1)$$

Mathematical Expression 2

$$\theta_U = \theta_L \cdot \theta_{SE} \quad (2)$$

First, it is assumed to correct a change in a secondary electron orbit by using the image shifts by the secondary electron aligners. An entry angle of the secondary electron orbit to the secondary electron aligner II(L) 33(b) is calculated by the following equation.

Mathematical Expression 3

$$\theta_{SE} = \tan^{-1}\left(\frac{L_{SE}}{z_{SEAPL} - z_{SE}}\right) \quad (3)$$

Here, notation $L_{SE}$ defines an amount of deflecting the secondary electron 2(a) by the image shifts by a distance from the axis at the secondary electron restriction plate 31. Notation $L_{SE}$ can be calculated by using a secondary electron arrival position detecting method, an electron orbit simulation or the like described later. Notation $Z_{SEAP}$ designates a height of the secondary electron restriction plate, and notation $Z_{SE}$ designates an imaginary ejecting height (=$L_{SE}$/tan($\theta_{SE}$)) of the secondary electron, which can be calculated by an estimation from an experimental value, an electron orbit simulation or the like. Notation $\theta_L$ which is necessary for the secondary electron aligner II (L) 33(b) can be calculated from Mathematical expression (1) as the following mathematical expression.

Mathematical Expression 4

$$\theta_L = \frac{\pi}{2} + \theta_{SE} - \tan^{-1}\left(\frac{z_{SEALU} - z_{SEALL}}{L_L}\right) \quad (4)$$

$\theta_U$ which is necessary for the secondary electron aligner II(U) 33(a) can be calculated from Mathematical expressions (2) and (4) as in the following mathematical expression.

Mathematical Expression 5

$$\theta_L = \frac{\pi}{2} - \tan^{-1}\left(\frac{z_{SEALU} - z_{SEALL}}{L_L}\right) \quad (5)$$

Incidentally, although the expression has been given by using the sectional view in FIG. 2, actually, it is necessary to carry out the control also with regard to an azimuth direction in consideration of rotation by a magnetic field at the objective lens 17. At this occasion, a rotation angle by the magnetic field is previously calculated with regard to the image shift, and each component of the azimuth of each secondary electron aligner, and the control is carried out by a matrix calculation. The rotation angle by the magnetic field can be calculated by using the secondary electron arrival position detecting method, the electron orbit simulation or the like described later.

Figure 3:
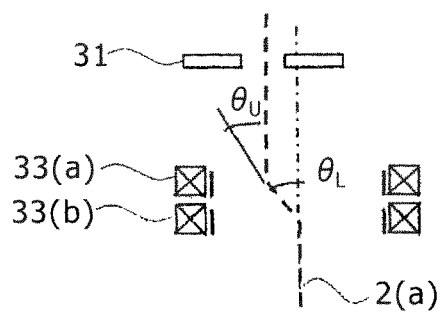
FIG. 3 is a view showing an example of the deflected orbit of the secondary signal by the secondary signal deflector.

Next, FIG. 3 shows a method of controlling the secondary electron 2(a) to deflect to the aperture at outside of the axis in the secondary electron restriction plate 31. When the secondary electron 2(a) in a case of not using the image shifts is controlled such that $\theta_L$ and $\theta_U$ are directed by the same angle and in directions opposed to each other, only the position of the orbit can be shifted while maintaining to be in parallel with the axis. According to the principle, the orbit of the secondary electron is only moved in parallel, and therefore, the orbit of the secondary electron can be controlled independently from interlocking with the image shifts. When a necessary moving amount of the orbit on the secondary electron restriction plate is designated by notation $L_{SHIFT}$, terms of parallel movement can be added to mathematical expressions (4) and (5).

Mathematical Expression 6

$$\theta_L = \frac{\pi}{2} + \theta_{SE} - \tan^{-1}\left(\frac{z_{SEALU} - z_{SEALL}}{l_{SEALL}}\right) + \tan^{-1}\left(\frac{L_{SHIFT}}{Z_U - Z_L}\right) \quad (6)$$

Mathematical Expression 7

$$\theta_L = \frac{\pi}{2} - \tan^{-1}\left(\frac{z_{SEALU} - z_{SEALL}}{l_{SEALL}}\right) + \tan^{-1}\left(\frac{L_{SHIFT}}{Z_U - Z_L}\right) \quad (7)$$

Figure 4:
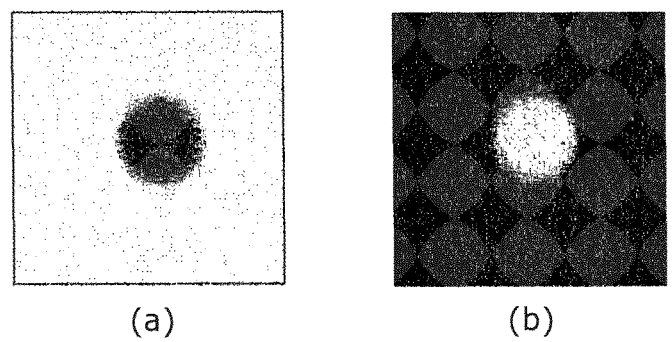
FIGS. 4(*a*) and 4(*b*) illustrate views showing an example of an image projecting a secondary electron restriction plate.

It is necessary to know deflection sensitivities of the image shift and the secondary electron aligner with regard to the secondary electron, and a rotation direction in an azimuth angle in order to control $\theta_L$ and $\theta_U$ in accordance with the above mathematical expressions. According to the present embodiment, it is utilized that when the primary electron is scanned on the sample by using the deflectors, also the secondary electron is scanned on the secondary electron restriction plate 31 simultaneously. When the primary electron is deflected by the deflectors 21 and 22 and is irradiated on the sample, the ejected secondary electron 2(a) progresses to the deflectors in the inverse direction after passing through the objective lens to reach the secondary electron restriction plate 31. Here, although the secondary electron 2(a) has dispersions in an energy and an angle ejected, the secondary electron 2(a) is converged to the secondary electron restriction plate 31 by focusing operations of a magnetic field lens and an electrostatic lens depending on conditions of the objective lens 17 and the acceleration tube 18. In this case, when a signal detected by the lower detector 28(b) is visualized into an image, the aperture of the secondary electron restriction plate 31 is obtained as a dark image as shown in FIG. 4(a) by reflecting a shape of the secondary electron restriction plate. On the other hand, when the signal is detected by the upper detector 28(a), the aperture of the secondary electron restriction plate 31 is obtained as a bright image as shown in FIG. 4(b).

A position of the aperture in a screen reflects a scanning range on the secondary electron restriction plate 31, and therefore, the position of the aperture is changed when the image shift or the secondary electron aligner is used. Therefore, the deflection sensitivity of the image shift or the secondary electron aligner, the angle in the azimuth angle direction can be calculated conversely from an amount of changing the aperture position. When an optical condition is deviated from a constant optical condition, the secondary electron 2(a) does not converge to the secondary electron restriction plate 31, and therefore, a contour of the aperture is dimmed and it is difficult to confirm the aperture position. In this case, the orbit of the secondary electron may be tracked by the electron orbit simulation. When a simulation result is corrected concerning the sensitivity of the secondary electron aligner and the shift in the azimuth direction by comparing with an experiment under a condition of converging the secondary electron, the secondary electron orbit can be controlled accurately even under various optical conditions. Incidentally, the secondary electron arrival position may directly be detected by installing a detector having a spatial resolution as the secondary electron restriction plate 31. Also, the contrast of the aperture is produced by whether the secondary electron passes through the aperture of the secondary electron restriction plate 31, and therefore, when signals detected by the upper detector 28(a) and the lower detector 28(b) are added, imaging a shadow of the aperture can be vanished.

Figure 5:
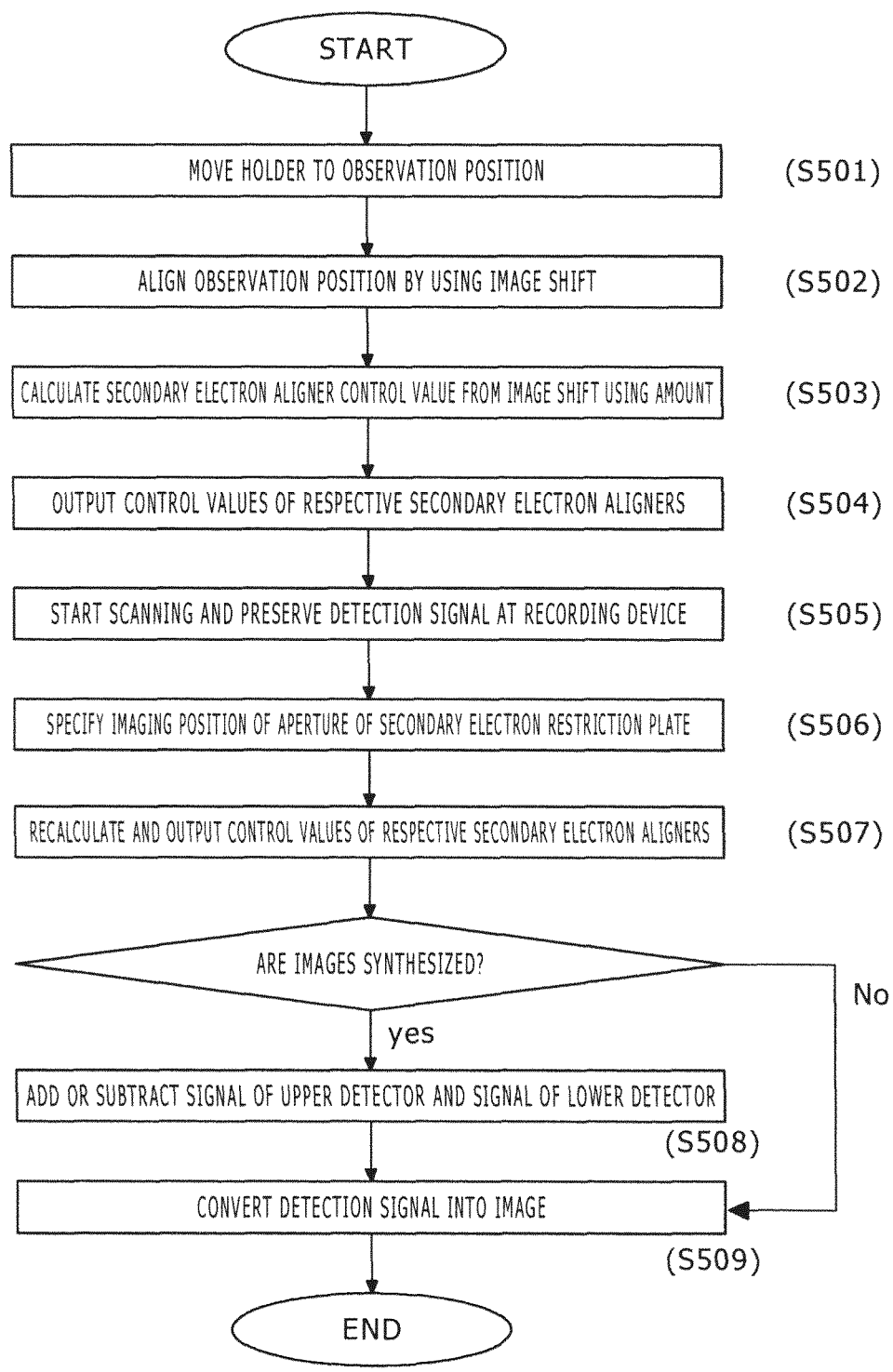
FIG. 5 is a flowchart showing steps of configuring a synthesized image by using two detectors.

A method of discriminating a signal by operating the secondary electron aligner to interlock with the image shift will be shown as a first embodiment. FIG. 5 is a flowchart showing steps of configuring a synthesized image by using the two detectors. First, the sample 23 is held at a desired observation position by moving the holder 24 (step 501). The image shifts are used in a range of several μm in order to irradiate a desired pattern with the primary electron at the position (step 502).

Control amounts of the secondary electron aligner II(U) 33(a) and the secondary electron aligner II(L) 33(b) for guiding the high angle secondary electron 2(a) to the secondary electron restriction plate 31 is calculated based on amounts of using the image shifts (step 503). When the control amount (operating condition of deflection current, or voltage or the like) and an image shift amount (operating condition of deflection current, or voltage or the like) are related to each other and stored to a memory, not illustrated, the condition can be reproduced at a later stage.

At this occasion, the aperture of the secondary electron restriction plate 31 may be disposed on the axis and common to the primary electron passing aperture, or may be installed at outside of the axis. Ina case where the secondary electron restriction plate 31 is arranged at outside of the axis, or in a case where the secondary electron restriction plate 31 is disposed at a position remote from the axis by a shift in the axis or the like, an imaging position to an image of the aperture of the secondary electron restriction plate 31 appears at a position remote from a screen center. A secondary electron arrival position is previously adjusted based on a control equation against these shifts (step 504).

In a case where the energy filter is used, a secondary electron aligner I 32 is made to be able to control to bring about a highly efficient entry angle of the energy filter. Both of the secondary electron aligners are made to be previously adjusted concerning a Wien condition of an electric field and a magnetic field and calculate the deflection sensitivities. Scanning is started by inputting scanning signals to the deflectors, and signals detected by the upper detector 28(a) and the lower detector 28(b) are preserved in a storage device 45 (step 505).

At this occasion, it is necessary to consider a possibility of deflecting the secondary electron orbit by sample electrification. It is known that when an insulating sample is irradiated with the primary electron, in a case where numbers of incident primary electrons and ejected secondary electrons differ from each other, the sample is electrified positively or negatively. When the sample is electrified, the secondary electron is deflected by an electric field produced by electrification, and therefore, the secondary electron 2(a) of the high angle component arrives at a position deviated from the aperture of the secondary electron restriction plate 31 and an angle discriminating function is deteriorated.

In this case, it is necessary to control again the secondary electron orbit separately from the previously adjusted positional shift of the aperture from a change in the imaging position of the aperture of the secondary electron restriction plate 31. The imaging position of the aperture of the secondary electron restriction plate 31 is specified from the image, and a distance and an angle from the center of the screen are calculated (step 506). A sensitivity of changing the position of the aperture with regard to the secondary electron aligner has previously been known in adjusting, and therefore, control amounts of the secondary electron aligner II (U) 33(a) and the secondary electron aligner II(L) 33(b) which are necessary for moving the aperture position to the screen center are calculated again and outputted (step 507).

Next, it is assumed that it is previously set by an operator whether images are synthesized. In a case where images are synthesized with an object of an increase in the image S/N, or a reduction in imaging the aperture of the secondary electron restriction plate 31, signals from the upper detector 28(a) and the lower detector 28(b) are converted into images after subjecting the signals to multiplication/division or addition/subtraction based on an arbitrary calculation equation (steps 508, 509). In a case where the images are not synthesized, two sheets of images detected by the respective detectors can simultaneously be acquired. At the upper detector 28(a), a signal of a high angle component or a signal of a high angle component which is subjected to energy filter is detected, and at the lower detector 28(b), a signal of a low angle component is detected. For example, a way of use of observing dividedly a pattern bottom portion and a pattern upper portion simultaneously can be carried out by detecting information of the pattern bottom portion which is more included in the high angle component by the upper detector 28(a), and detecting information of the pattern upper portion which is more included in the low angle component by the lower detector 28(b).

Figure 6:
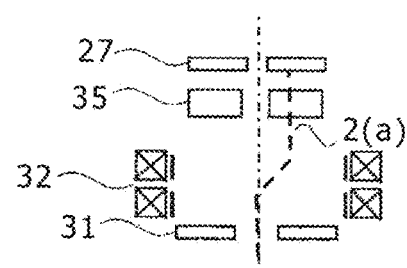
FIG. 6 is a view showing an example of a deflected orbit of an electron which enters an energy filter by a deflector.

A description will be given of a combination using a secondary electron aligner and an energy filter as a second embodiment. A relationship of an energy resolution of the energy filter depends on a dispersion in an electric field and a dispersion in an angle of incidence of an electron. A change in the angle of incidence of an electron configures a factor of causing a dispersion in an image contrast since the change in the angle of incidence changes a threshold energy of the energy filter. When the secondary electron aligners II(U) 33(a) and the secondary electron aligner II (L) 33(b) are used, the secondary electron 2(a) can be passed through a center of the secondary electron restriction plate in parallel with the axis. When a constant value is always inputted to the secondary electron aligners I 32 under the state, an angle of the secondary electron which is incident on the energy filter can be maintained constant regardless of the use of the image shift, and therefore, an image can be acquired by making the contrast stable. Furthermore, when the secondary electron aligners I 32 are configured by two stages of Wien filters as shown in FIG. 6, the secondary electron 2(a) can be made to be in parallel with the axis when the secondary electron 2(a) is incident on the energy filter 35, and therefore, in a case where the filter is configured by a mesh, an electrode or the like, an ideal energy resolution can be anticipated.

A description will be given of a method of restraining a spread of a primary electron on a sample by cancelling aberrations which are generated by secondary electron aligners per se by arranging plural pieces of the secondary electron aligner as a third embodiment. In an ideal Wien filter, only a secondary electron can be deflected without being influenced by an orbit of a primary electron. However, generally, an electric field and a magnetic field which are generated by a Wien filter do not necessarily coincide with each other along the axis. A primary electron has an energy dispersion when the primary electron is emitted from the electron source, an orbit dispersion is generated in passing a Wien filter, and therefore, a beam spread is generated on a sample. A method of deflecting a beam in directions opposed to each other by arranging a pair of equivalent Wien filters on upper and lower sides is known as means for avoiding the beam spread.

The secondary electron aligners II(U) 33(a) and the secondary electron aligner II (L) 33(b) are used in directions canceling each other, and therefore, a generated aberration is inconsiderable. Another secondary electron aligner is provided on an upper side of the reflection plate 27 which is not related to a control of a secondary electron in order to cancel the aberration of the secondary electron aligners I 32. It is preferable to control the added secondary electron aligner to deflect always in a direction opposed to that of the secondary electron aligners I32 by the same angle regardless of an orbit of the secondary electron. In a case where amounts used at a pair of the secondary electron aligners differ from each other, for example, in a case where, an aberration which remains when the secondary electron aligner II(U) 33(a) and the secondary electron aligner II(L) 33(b) are used is concerned, the aberration may be superposed on the secondary electron aligner control to cancel the aberration.

Figure 7:
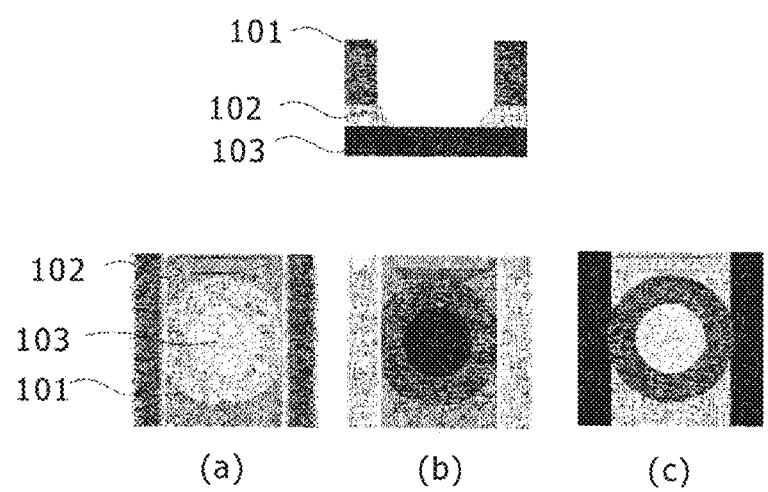
FIGS. 7(*a*)-7(*c*) illustrate views showing an example of a synthesized image based on an output of a two stage detector.

A description will be given of a method of synthesizing images which are detected at two upper and lower stages as a fourth embodiment. A view shown at an upper portion of FIG. 7 shows a section of an example of a device structure which is an object of observation. A pattern 101 is a pattern having a line shape disposed at an upper portion, there is a film 102 having a tapered hole pattern therebelow, and there is a film 103 at a lower layer thereof. When the device structure is observed from a top side by the upper detector 28(a), an image having a bright contrast of the lower layer 103 is obtained as shown in FIG. 7(a). This is because the image is a result of selectively detecting the secondary electron (a) having a high angle component by using the secondary electron restriction plate 31, and the bottom portion 103 includes a number of secondary electrons which are ejected in a high angle direction. On the other hand, when the secondary electron is detected by the lower detector 28(b), a contrast of the top portion 101 is conversely emphasized as shown in FIG. 7(b). This is because secondary electrons ejected from the line portion include much of low angle components. Here, in a case where a contour of a boundary of a taper of the intermediate layer 102 and the lower layer 103 is intended to observe, the contrast of the line 101 is unnecessary extraneous information. Hence, an image brightness degree is subjected to multiplication and division such that brightness degrees of the line portions 101 in FIG. 7(a) and FIG. 7(b) become the same, and FIG. 7(b) is subtracted from FIG. 7(a) under the state. That is, a synthesized image is configured to cancel a contrast of a specific portion of the image. Then, an image erasing the contrast of the line portion 101 can be obtained as shown in FIG. 7(c). In the image, the contrast of line portion 101 is eliminated, and therefore, a dynamic range of a brightness degree at a boundary portion of the intermediate layer 102 and the lower layer 103 which is a desired observation position can be widened, and an accurate observation can be carried out. When the brightness degree of the synthesized image is made to be able to be adjusted in acquiring the image, the synthesized image can be acquired by optimizing the dynamic range.

Incidentally, although the explanation has been given of an example of detecting the electron ejected from the sample after converting the electron into the tertiary electron by using the conversion electrode in the embodiments described above, a detector which directly detects an electron that is ejected from a sample as in an MCP (Multi Channel Plate) detector will do in place of the conversion electrode. In this case, the detector which is arranged at the lower stage becomes a shielding member for shielding a low angle component.

According to the embodiments described above, an always equivalent image can be obtained even when the image shift is used by maintaining a detection efficiency constant when the secondary electron restriction plate is used by controlling the orbit of the secondary electron. Also, the secondary electron is made to be able to ingress to the energy filter which is arranged at an upper stage of the secondary electron restriction plate, and therefore, an image can stably be acquired by maintaining the energy resolution constant.

LIST OF REFERENCE SIGNS 11 anode
12 extraction electrode
13 extraction voltage
14 condenser lens
15 diaphragm
17 objective lens
18 acceleration circular cylinder
20 guide
21 upper scanning deflector
22 lower scanning deflector
23 sample
24 holder
25 upper image shift
26 lower image shift
27 reflection plate
28(a) upper detector
28(b) lower detector
31 secondary electron restriction plate
32 secondary electron aligner I
33(a) secondary electron aligner II(U)
33(b) secondary electron aligner II(L)
34 energy filter

The invention claimed is:

1. A scanning electron microscope comprising:
an electron source;
a deflector to deflect a scanning area of an electron beam emitted from the electron source; and
a control unit to control the deflector,
the scanning electron microscope further including:
a first detector to detect an electron provided by irradiating a sample with the electron beam;
an opening configuring member arranged between the first detector and the deflector and having an opening for passing the electron beam; and
a secondary signal deflector having an upper deflector and a lower deflector to deflect the electrons emitted from the sample,
wherein the control device controls
the lower deflector to deflect the electrons deflected by the deflector depending on a deflection condition of the deflector so as to direct the electrons deflected by the deflector at a trajectory of the electron beam, and
the upper deflector to deflect the electrons deflected by the lower deflector depending on the deflection condition of the deflector to direct the electrons deflected by the lower deflector at the opening.

2. The scanning electron microscope according to claim 1, wherein the opening portion configuring member is a conversion electrode for generating an electron by colliding an electron, and includes a second detector for detecting the electron generated by the conversion electrode.

3. The scanning electron microscope according to claim 1, wherein the opening portion configuring member is a second detector for detecting the electron.

4. The scanning electron microscope according to claim 1, further comprising:
a second detector to detect the electron ejected in a range wider than a range of the first detector centering on an axis of the electron beam; and
a calculating unit to synthesize outputs of the first detector and the second detector.

5. The scanning electron microscope according to claim 4, wherein the calculating unit processes the outputs of the first detector and the second detector such that contrasts of a specific pattern are equal to each other, and synthesizes the outputs of the first detector and the second detector to erase the contrasts of the specific pattern.

6. The scanning electron microscope according to claim 1, wherein the deflector is an image shift deflector to deflect a scanning position of the electron beam, and the control unit controls the secondary signal deflector in accordance with a scanning position of the electron beam.

7. The scanning electron microscope according to claim 1, wherein an energy filter is arranged on a side of the electron source of the opening configuring member.

8. The scanning electron microscope according to claim 7, further comprising:
   a deflector for adjusting an angle of incidence of the electron to the energy filter.

9. The scanning electron microscope according to claim 1, further comprising:
   a memory to store a control amount of the deflector and an operating condition of the secondary signal deflector to be related with each other.

10. The scanning electron microscope according to claim 1, wherein the secondary signal deflector is a Wien filter.

11. A scanning electron microscope comprising:
    an electron source;
    a deflector to deflect a scanning area of an electron beam emitted from the electron source; and
    a control unit to control the deflector,
    the scanning electron microscope further including:
    a first detector to detect an electron provided by irradiating a sample with the electron beam;
    a second detector to detect an electron emitted in a range relatively wider than a range of the first detector by centering on an axis of the electron beam, or an electron provided by the electron; and
    a calculating unit configured to:
      form a first image based on an output of the first detector and a second image based on an output of the second detector,
    adjust at least one of brightness of parts of the first image and the second image so as to narrow a brightness difference between the parts of the first image and the second image, and
    subtract the second image from the first image after adjusting at least one of brightness of parts of the first image and the second image.

* * * * *